United States Patent
Lee et al.

(10) Patent No.: US 10,043,824 B2
(45) Date of Patent: Aug. 7, 2018

(54) SEMICONDUCTOR DEVICE INCLUDING A VACUUM GAP AND METHOD FOR MANUFACTURING THE SAME

(71) Applicant: Vanguard International Semiconductor Corporation, Hsinchu (TW)

(72) Inventors: Tsung-Hsiung Lee, Taoyuan (TW); Chun-Ting Yang, New Taipei (TW); Ho-Chien Chen, Keelung (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/380,372

(22) Filed: Dec. 15, 2016

(65) Prior Publication Data

US 2018/0175063 A1  Jun. 21, 2018

(51) Int. Cl.
*H01L 27/12* (2006.01)
*H01L 21/308* (2006.01)
(Continued)

(52) U.S. Cl.
CPC .... *H01L 27/1203* (2013.01); *H01L 21/02274* (2013.01); *H01L 21/3081* (2013.01);
(Continued)

(58) Field of Classification Search
CPC ............. H01L 27/1203; H01L 21/3086; H01L 21/02274; H01L 21/76877;
(Continued)

(56) References Cited

U.S. PATENT DOCUMENTS 6,921,704 B1  7/2005  Wu et al.
2010/0330799 A1*  12/2010  Hamanaka .......... H01L 21/7682
                                                  438/618
(Continued)

FOREIGN PATENT DOCUMENTS

TW   200711149 A   3/2007

OTHER PUBLICATIONS

Taiwanese Office Action and Search Report dated Apr. 9, 2018 for Application No. 105129058.

*Primary Examiner* — Steven Loke
*Assistant Examiner* — Juanita Rhodes
(74) *Attorney, Agent, or Firm* — Birch, Stewart, Kolasch & Birch, LLP

(57) ABSTRACT

The present disclosure relates to a semiconductor device. The semiconductor device includes a semiconductor on an insulator (SOI) substrate having a bottom substrate, a buried oxide layer on the bottom substrate, and a semiconductor layer on the buried oxide layer. The semiconductor device also includes a first dielectric layer disposed on the semiconductor layer, a first contact structure extending from a top surface of the first dielectric layer through the semiconductor layer and the buried oxide layer and contacting the bottom substrate, and a first trench extending into the semiconductor layer. A width of the first trench is smaller than a width of the first contact structure. The first dielectric layer seals the first trench at or near the top of the first trench to form a vacuum gap.

17 Claims, 9 Drawing Sheets

(51) Int. Cl.
*H01L 21/768* (2006.01)
*H01L 21/02* (2006.01)
*H01L 21/84* (2006.01)
*H01L 21/762* (2006.01)
*H01L 29/06* (2006.01)
*H01L 29/10* (2006.01)
*H01L 23/535* (2006.01)
*H01L 23/58* (2006.01)

(52) U.S. Cl.
CPC .... *H01L 21/3086* (2013.01); *H01L 21/76283* (2013.01); *H01L 21/76877* (2013.01); *H01L 21/84* (2013.01); *H01L 23/535* (2013.01); *H01L 23/585* (2013.01); *H01L 29/0649* (2013.01); *H01L 29/1087* (2013.01)

(58) Field of Classification Search
CPC ........... H01L 21/76283; H01L 21/3081; H01L 23/585; H01L 23/535; H01L 29/1087; H01L 29/0649; H01L 21/84; H01L 23/4821; H01L 21/7682; H01L 21/823475
See application file for complete search history.

(56) References Cited

U.S. PATENT DOCUMENTS

| | | | |
|---|---|---|---|
| 2012/0292746 A1* | 11/2012 | Lee | H01L 21/76898 257/621 |
| 2013/0320459 A1* | 12/2013 | Shue | H01L 21/76283 257/392 |
| 2015/0132918 A1 | 5/2015 | Cheng et al. | |
| 2015/0145029 A1 | 5/2015 | Lemke et al. | |
| 2015/0214143 A1* | 7/2015 | Tsai | H01L 23/5329 257/773 |
| 2015/0243544 A1* | 8/2015 | Alptekin | H01L 21/7682 438/586 |
| 2015/0364476 A1 | 12/2015 | Alptekin et al. | |
| 2016/0372372 A1* | 12/2016 | Gambino | H01L 21/76898 |

* cited by examiner

SEMICONDUCTOR DEVICE INCLUDING A VACUUM GAP AND METHOD FOR MANUFACTURING THE SAME

BACKGROUND

The present disclosure relates to a semiconductor device, and in particular it relates to a semiconductor device that includes a semiconductor on an insulator (SOI) substrate.

Semiconductor devices are used in a variety of electronic applications, such as personal computers, cell phones, digital cameras, and other electronic devices. These semiconductor devices are typically fabricated by depositing an insulating layer or dielectric layer, a conductive layer material, and a semiconductor layer material on the semiconductor substrate in sequence, followed by patterning the various material layers by using a photolithography process. Therefore, the circuit devices and components are formed on the semiconductor substrate.

Semiconductor devices including SOI substrates are promising in the semiconductor industry because they have the potential advantages of fast operation, low power loss, latch-up immunity, a simplified manufacturing processes, and small dimensions.

When SOI devices are used, it is sometimes desirable for voltage to be applied to the bottom substrate thereof. Therefore, conductive structures and isolation structures should be formed. However, existing technologies do not fully meet all requirements.

SUMMARY

In some embodiments, the present disclosure relates to a semiconductor device. The semiconductor device includes a semiconductor on an insulator (SOI) substrate including a bottom substrate, a buried oxide layer on the bottom substrate, and a semiconductor layer on the buried oxide layer. The semiconductor device also includes a first dielectric layer disposed on the semiconductor layer, a first contact structure extending from a top surface of the first dielectric layer through the semiconductor layer and the buried oxide layer and contacting the bottom substrate, and a first trench extending into the semiconductor layer. A width of the first trench is smaller than a width of the first contact structure, and the first dielectric layer seals the first trench at or near a top of the first trench to form a vacuum gap.

In other embodiments, the present disclosure relates to a method for manufacturing a semiconductor device. The method includes providing a semiconductor on an insulator substrate including a bottom substrate, a buried oxide layer on the bottom substrate, and a semiconductor layer on the buried oxide layer; forming a first trench and a second trench extending into the semiconductor layer and exposing a top surface of the buried oxide layer, and wherein a width of the first trench is smaller than a width of the second trench; forming a first dielectric layer on the semiconductor layer, wherein the first trench is not filled by the first dielectric layer, and the first dielectric layer seals the first trench at or near a top of the first trench to form a vacuum gap; removing a portion of the first dielectric layer and a portion of the buried oxide layer which is under the second trench by performing an etching process to expose the bottom substrate, and wherein the first dielectric layer still seals the first trench after performing the etching process; forming a first contact structure contacting the bottom substrate by filling the second trench with a conductive material.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
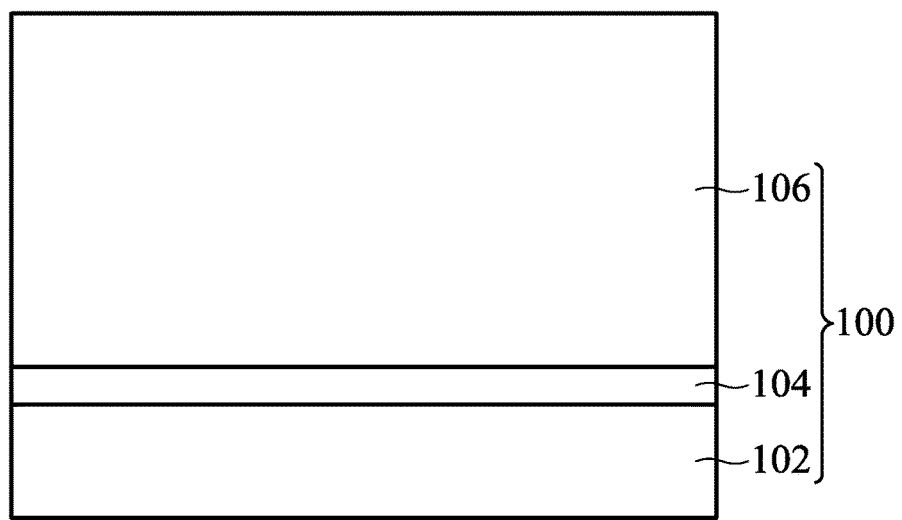
FIG. 1 is one of a series of cross-sectional views which illustrate a process for manufacturing semiconductor devices according to the embodiments of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Various embodiments of the present disclosure will be described below. In the interest of simplicity and clarity, similar reference numerals and/or letters might be used for similar elements. It should be understood that additional steps can be implemented before, during, or after the illustrated methods, and some steps might be replaced or omitted in other embodiments of the illustrated methods.

The method for forming semiconductor devices in the present disclosure involves forming a dielectric layer with bad step coverage on trenches with different widths, which results in different dielectric layer coverage profiles on trenches with different widths, such that the positions of the isolation structure and the contact structure can be directly defined without using additional etching masks.

FIG. 1 illustrates the initial step of some embodiments of the present disclosure. Firstly, a SOI substrate 100 is provided. The substrate 100 includes a bottom substrate 102 with a first side (or front side) and a second side (or back side) which is opposite to the first side, a buried oxide layer 104 disposed on the first side of the bottom substrate 102, and a semiconductor layer 106 disposed on the buried oxide layer 104. For example, the bottom substrate 102 and the semiconductor layer 106 may respectively include silicon (Si), and the buried oxide layer 104 may include silicon oxide ($SiO_2$). In other embodiments, the semiconductor layer 106 may include other elementary semiconductor materials such as germanium (Ge). In some embodiments the semiconductor layer 106 may include compound semiconductor such as silicon carbide (SiC), gallium arsenic (GaAs), indium arsenide (InAs), or indium phosphide (InP). In some embodiments the semiconductor layer 106 may include alloy semiconductor such as silicon germanium (SiGe), silicon germanium carbide (SiGeC), gallium arsenic phosphide (GaAsP), or gallium indium phosphide (GaInP).

Various semiconductor devices may be formed on the semiconductor layer 106. The semiconductor devices formed on the semiconductor layer 106 may be various active devices, passive devices, other suitable devices, or a combination thereof. For example, the active devices may include different types of transistors (e.g., metal-oxide-semiconductor field-effect transistors, complementary metal-oxide-semiconductor transistors, bipolar junction transistors, high voltage transistors, high-frequency transistors, or laterally diffused metal-oxide-semiconductor transistors), or diodes. The passive devices may include resistors or capacitors. Various processes may be performed to form the semiconductor devices, such as deposition, etching, implanting, photolithography processes, annealing processes and/or other applicable processes. These processes are not related to the features of the present disclosure, in the interest of simplicity, they are not described in detail herein.

Figure 2:
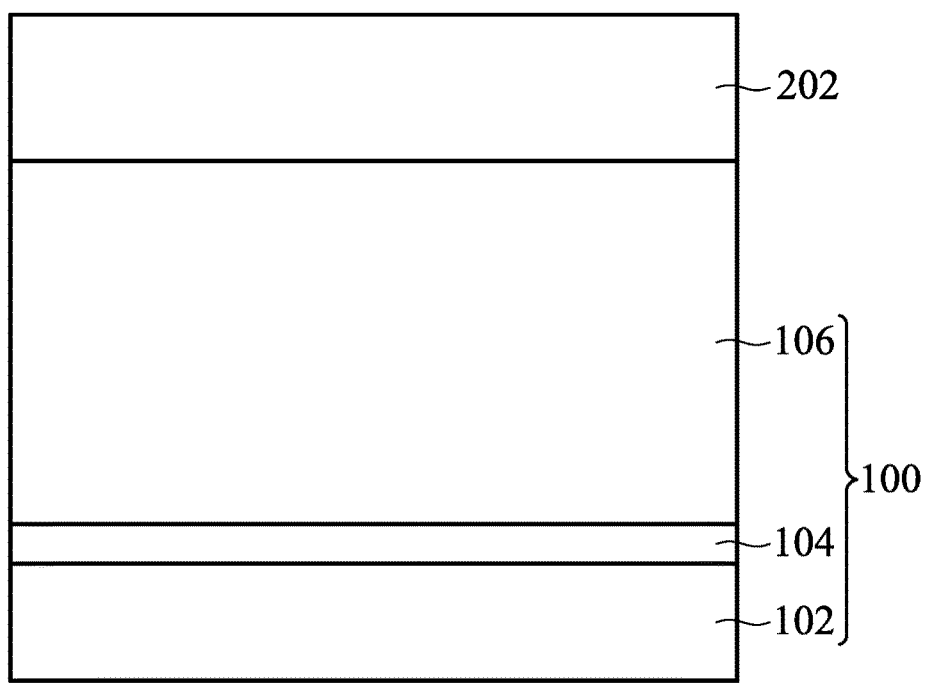
FIG. 2 is one of a series of cross-sectional views which illustrate a process for manufacturing semiconductor devices according to the embodiments of the present disclosure.

Then, as shown in FIG. 2, a hard mask layer 202 is formed on the semiconductor layer 106. For example, the hard mask layer may include silicon nitride, silicon oxide, other suitable materials, or a combination thereof. In some embodiments, the hard mask layer 202 may be formed using a low-pressure chemical vapor deposition (LPCVD) process, a plasma-enhanced chemical vapor deposition (PECVD) process, another suitable process, or a combination thereof.

Figure 3:
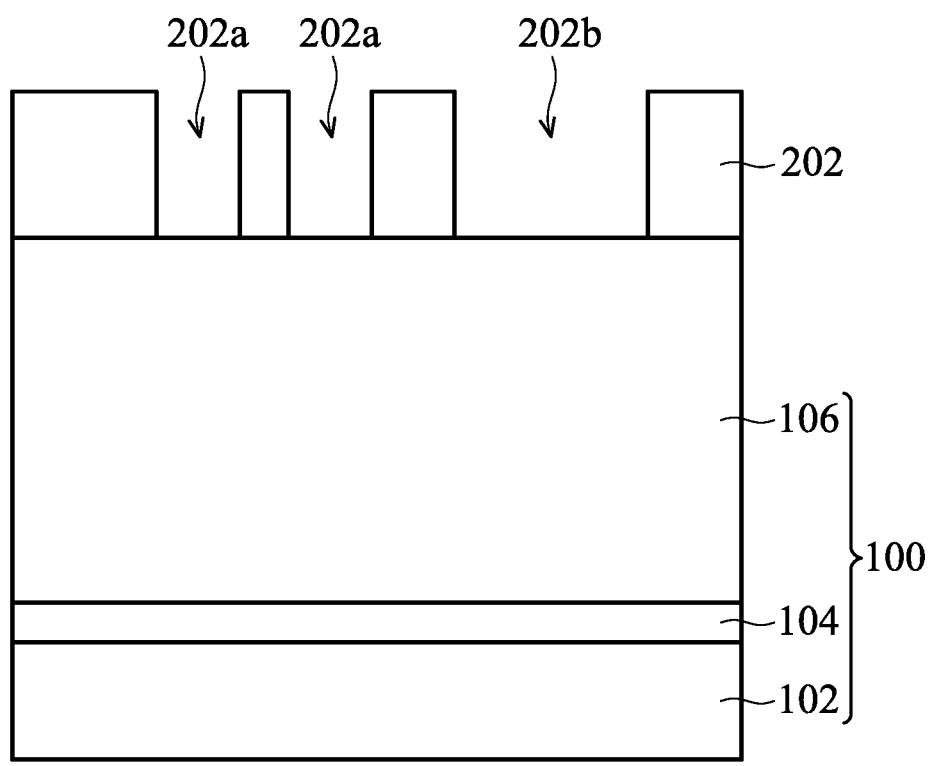
FIG. 3 is one of a series of cross-sectional views which illustrate a process for manufacturing semiconductor devices according to the embodiments of the present disclosure.

Then, as shown in FIG. 3, the hard mask layer 202 is patterned to form openings 202a and 202b. Openings 202a and 202b respectively correspond to patterns of an isolation structure and a contact structure which will subsequently be formed. The process of patterning the hard mask layer 202 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process (e.g., an anisotropic plasma etching method), a wet etching process, or a combination thereof.

Figure 4:
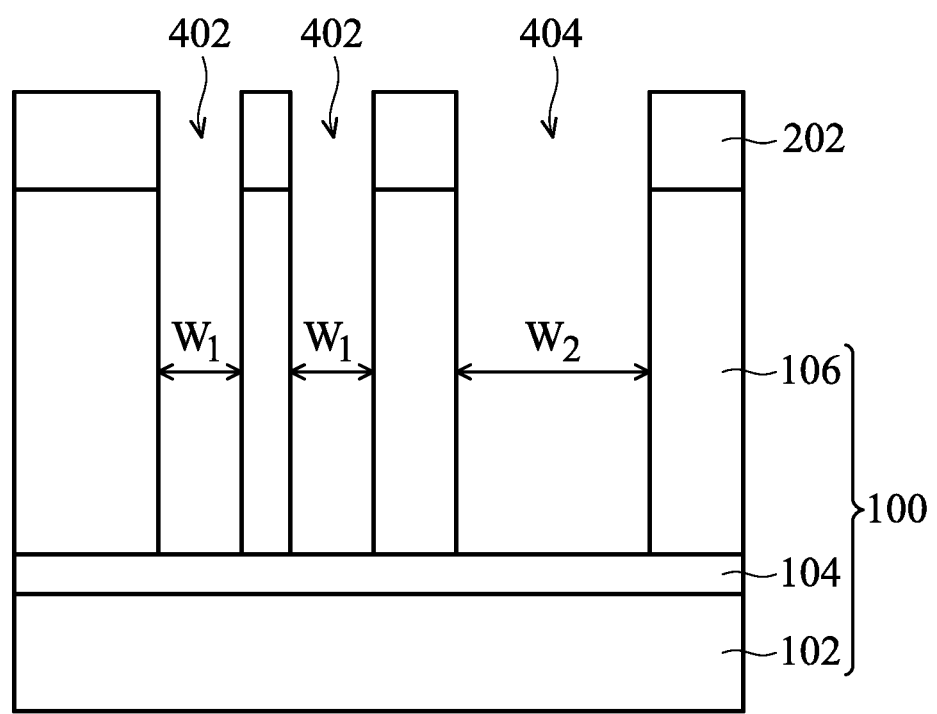
FIG. 4 is one of a series of cross-sectional views which illustrate a process for manufacturing semiconductor devices according to the embodiments of the present disclosure.

As shown in FIG. 4, an etching process is performed to remove a portion of the semiconductor layer 106 by using the patterned hard mask 202 as an etching mask, such that a first trench 402 and a second trench 404 are formed in the semiconductor layer 106, and a top surface of a portion of the buried oxide layer 104 is exposed. In subsequent steps, the first trench 402 will be sealed to form an isolation structure, and the second trench 404 will be filled by a conductive material to form a conductive structure. The first trench 402 has a first width $W_1$, and the second trench 404 has a second width $W_2$. In some embodiments, the first width $W_1$ is smaller than the second width $W_2$. For example, the ratio of the first width $W_1$ to the second width $W_2$ (i.e., $W_1/W_2$) may be in a range from 1:1.2 to 1:5. The depths of the first trench 402 and the second trench 404 may be 2 μm to 80 μm. In addition, from a top view, the first trench 402 and the second trench 404 may respectively be ring-shaped, round, rectangular, or another suitable shape.

The etching process may include a dry etching process (e.g., an anisotropic plasma etching method), a wet etching process, or a combination thereof. In some embodiments of using the dry etching process, the first trench 402 and the second trench 404 with high aspect ratios can be better formed. It should be noted that, although the hard mask 202 is used as an etching mask in the illustrated embodiments for the purpose of description herein, in other embodiments, a patterned photoresist can also be used as the etching mask to etch the semiconductor layer 106 to form the first trench 402 and the second trench 404.

Figure 5A:
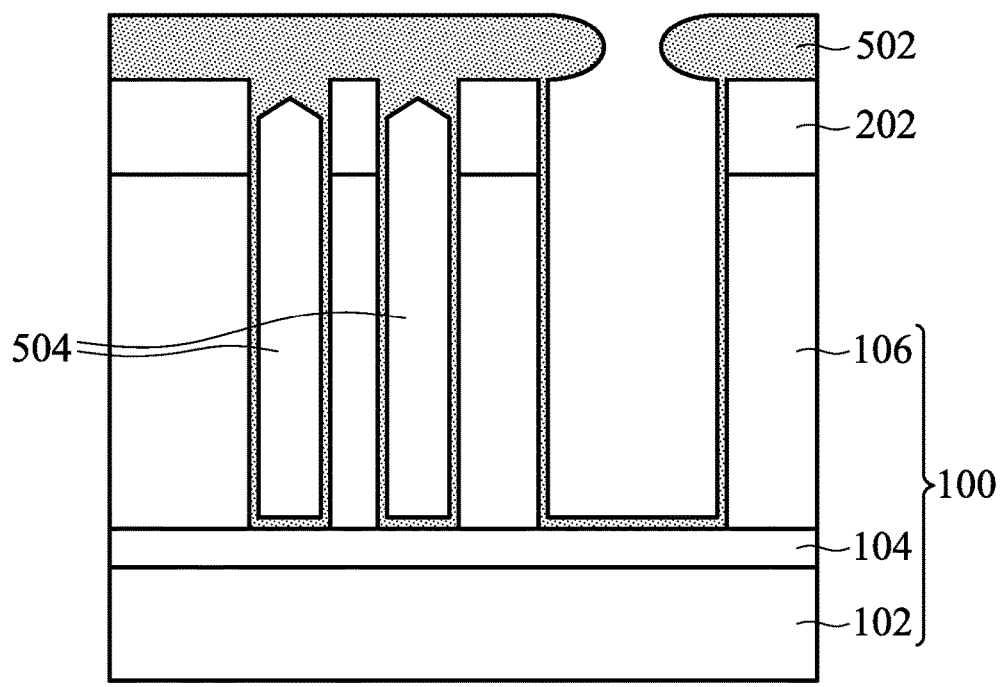
FIG. 5A is one of a series of cross-sectional views which illustrate a process for manufacturing semiconductor devices according to the embodiments of the present disclosure.
Figure 5B:
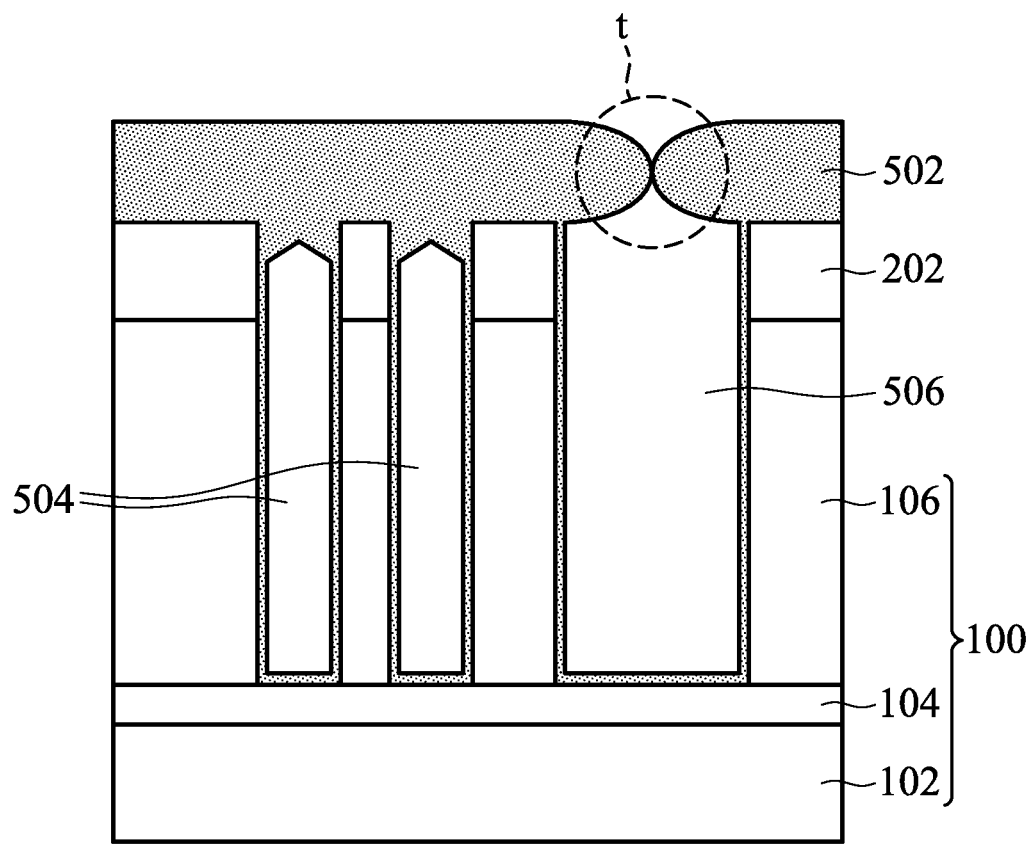
FIG. 5B is one of a series of cross-sectional views which illustrate a process for manufacturing semiconductor devices according to the embodiments of the present disclosure.

As shown in FIG. 5A-5B, a first dielectric layer 502 is formed on the hard mask 202, sidewalls of the first trench 402 and the second trench 404, and the top surface of the buried oxide layer exposed by the first trench 402 and the second trench 404.

In some embodiments, the first dielectric layer 502 seals the first trench 402, but does not seal the second trench 404, as shown in FIG. 5A. For example, the first dielectric layer 502 can be formed by using PECVD or another deposition process having bad step coverage in a vacuum environment, such that the first dielectric layer 502 has sealed the first trench 402 at or near a top of the first trench 402 to form a first high vacuum gap 504 before the first trench 402 and the second trench 404 are filled by the first dielectric layer 502. For example, the first high vacuum gap 504 can provide good isolation. In addition, since the width $W_2$ of the second trench is greater than the width $W_1$ of the first trench, when the first high vacuum gap 504 is formed, the second trench 404 remains unsealed.

In some other embodiments, the first dielectric layer 502 is deposited to further seal the second trench 404 to form a second high vacuum gap 506, as shown in FIG. 5B. It should be noted that the thickness t of the first dielectric layer 502 on the second high vacuum gap 506 is smaller than the thickness of the first dielectric layer 502 on the first high vacuum gap 504, which is advantageous to a subsequent etching process.

For example, the first dielectric layer 502 may include a silicon oxide, silicon nitride, silicon oxynitride, phosphosilicate glass (PSG), borophosphosilicate glass (BPSG), another suitable material, or a combination thereof. In some embodiments, the first dielectric layer 502 includes a silane-based oxide, tetraethyl orthosilicate, TEOS-based oxide, or a combination thereof.

Figure 6:
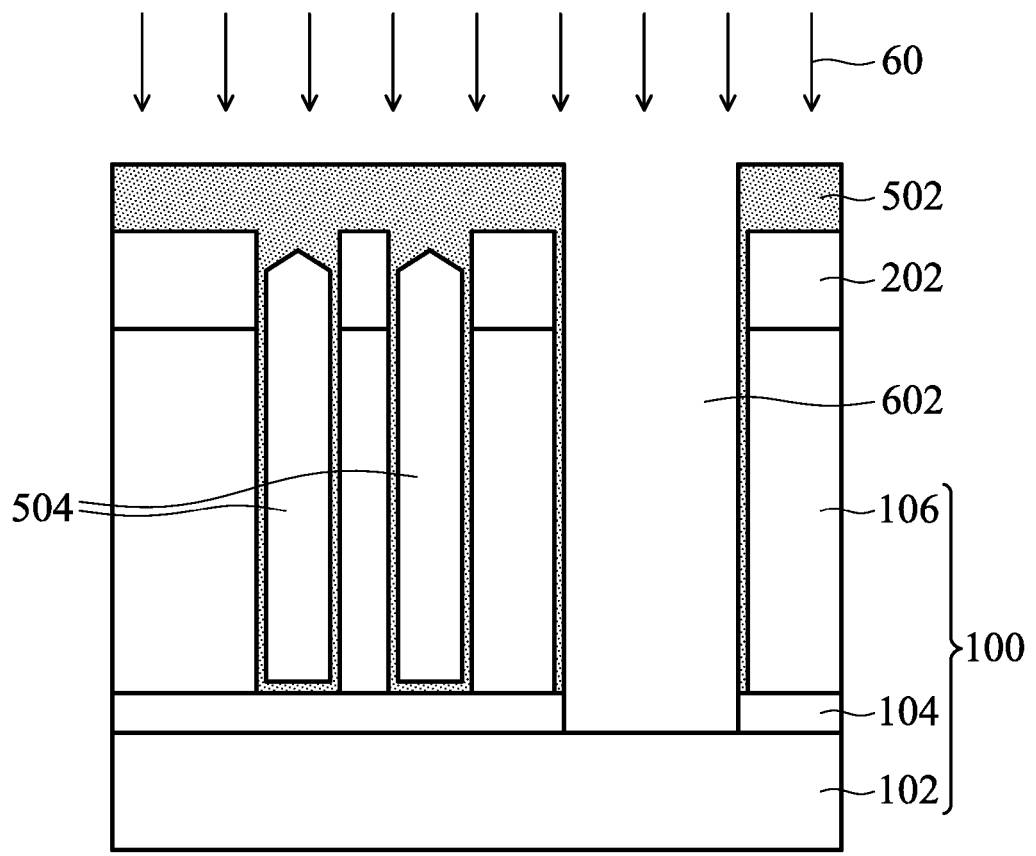
FIG. 6 is one of a series of cross-sectional views which illustrate a process for manufacturing semiconductor devices according to the embodiments of the present disclosure.

As shown in FIG. 6, an etching process 60 is performed to remove a portion of the first dielectric layer 502, and a portion of the buried layer 104 under the second trench 404 or under the second high vacuum gap 506 to form a third trench 602 which exposes a top surface of a portion of the bottom substrate 102. For example, the etching process may include a dry etching process (e.g., an anisotropic plasma etching method), a wet etching process, or a combination thereof. In some embodiments, after the etching process 60 is performed, a portion of the first dielectric layer 502 remains on sidewalls of the third trench 602. In other embodiments, none of the first dielectric layer 502 remains on sidewalls of the third trench 602.

It should be noted that, after the third trench 602 is formed, the first dielectric layer 502 still seals the first trench 402, such that the first high vacuum gap 504 remains substantially intact, thus providing good isolation. Additionally, in the present disclosure, at least partly resulting from the second trench 404 not being sealed by the first dielectric layer 502 (as shown in FIG. 5A) or the thickness of the first dielectric layer 502 on the second high vacuum gap 506 being smaller than the thickness of the first dielectric layer 502 on the first high vacuum gap 504 (as shown in FIG. 5B), no additional etching masks such as a patterned photoresist layer should be formed on the first dielectric layer 502 to define the position of the third trench 602 after forming the first dielectric layer 502 and before performing the etching process 60. Therefore, the methods of the present disclosure can eliminate the problem of the photoresist layer not being completely developed when the trench has a greater depth (e.g., greater than 3 μm), reduce the manufacturing cost of masks and lithography process, and reduce the thickness of the dielectric layer.

Figure 7:
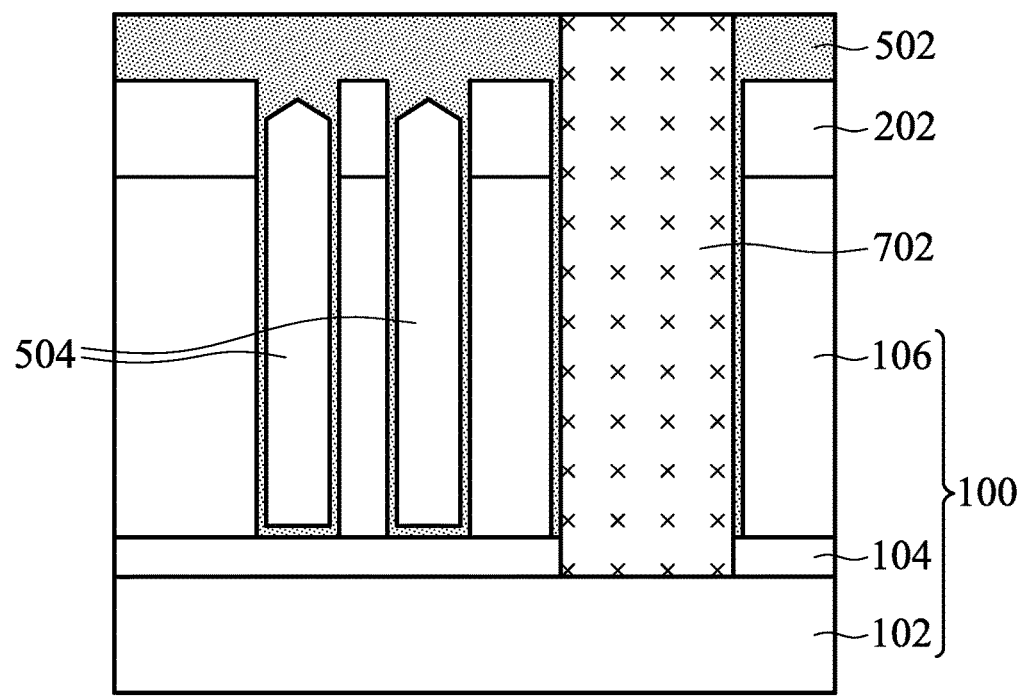
FIG. 7 is one of a series of cross-sectional views which illustrate a process for manufacturing semiconductor devices according to the embodiments of the present disclosure.

As shown in FIG. 7, the third trench 602 is filled by a conductive material to form a first contact structure 702 which is electrically connected to the bottom substrate 102. For example, the first contact structure 702 can be made of metal materials (e.g., W, Al, or Cu), metal alloys, poly-Si, or other suitable materials. In some embodiments, to fill up the third trench 602 with conductive materials, the first contact structure 702 is formed using a chemical vapor deposition process (CVD), a physical vapor deposition process (PVD, e.g., evaporation or sputter), an atomic layer deposition process (ALD), an electroplating process, another suitable process, or a combination thereof. In addition, after depositing the conductive materials, a chemical mechanical polishing (CMP) process or an etching back process can optionally be performed to remove the excess conductive materials.

In some embodiments, the first contact structure 702 is electrically connected to a voltage source which can provide or adjust the voltage of the bottom substrate 102 from the first side of the bottom substrate 102 through the first contact structure 702, rather than from the second side of the bottom substrate 102, such that additional processes for improving the contact impedance can be omitted, the cost can be reduced, and the flexibility of circuit layout can also be improved.

In some embodiments, before filling the third trench 602 with the conductive materials, an adhesion layer (not illustrated) can be optionally formed on sidewalls of the third trench 602. For example, the adhesion layer may include TiN, Ti, Ta, TaN, or other suitable conductive materials. The adhesion layer can be formed by using a physical vapor deposition process, an atomic layer deposition process, an electroplating process, another suitable process, or a combination thereof. The adhesion layer can improve the adhesion property between the conductive materials and the sidewalls of the trench, thus reducing undesirable effects on the semiconductor devices resulting from diffusion of the conductive materials.

Figure 8:
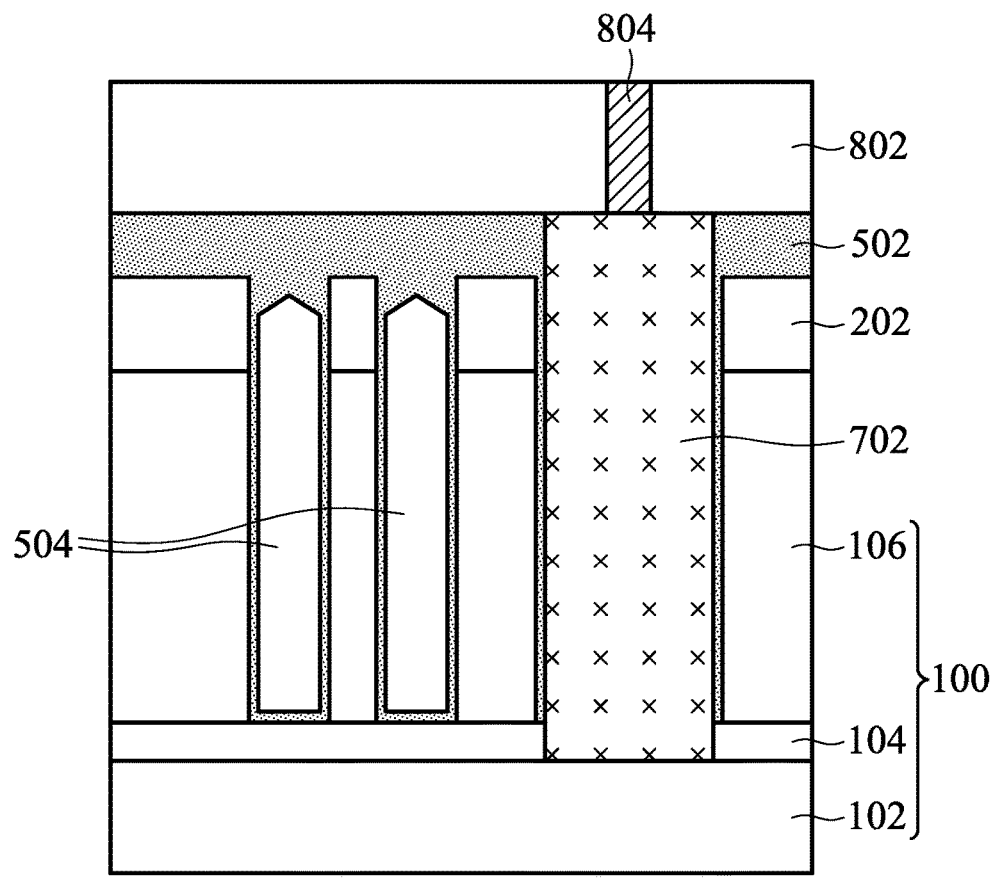
FIG. 8 is one of a series of cross-sectional views which illustrate a process for manufacturing semiconductor devices according to the embodiments of the present disclosure.

As shown in FIG. 8, an inter-layer dielectric (ILD) layer 802 is optionally formed on the first dielectric layer 502. For example, the inter-layer dielectric layer 802 may include a single-layer or multi-layered structure of one or more dielectric materials, such as silicon oxide, silicon nitride, silicon oxynitride, tetraethoxysilane, phosphosilicate glass (PSG), borophosphosilicate glass (BPSG), low k dielectric materials, or other suitable dielectric materials. For example, the inter-layer dielectric layer 802 can be formed using a chemical vapor deposition process, a physical vapor deposition process, an atomic layer deposition process, spin-on coating, or another suitable process. After the inter-layer dielectric layer 802 is deposited, a chemical mechanical polishing process or an etching back process can optionally be performed to remove the excess dielectric materials.

Then, a second contact structure 804 is formed in the inter-layer dielectric layer 802. For example, the second contact structure 804 can be made of metal materials (e.g., W, Al, or Cu), metal alloys, poly-Si, or other suitable materials. In some embodiments, the second contact structure 804 is formed by using a chemical vapor deposition process, a physical vapor deposition process (e.g., evaporation or sputter), an atomic layer deposition process, an electroplating process, another suitable process, or a combination thereof. In addition, after depositing the conductive materials, a chemical mechanical polishing (CMP) process or an etching back process can optionally be performed to remove the excess conductive materials.

In some embodiments, the first contact structure 702 is electrically connected to a voltage source through the second contact structure 804. The voltage source can provide or adjust the voltage of the bottom substrate 102 from the first side of the bottom substrate 102 through the second contact structure 804 and first contact structure 702, rather than from the second side of the bottom substrate 102.

In summary, the method for forming semiconductor devices in the present disclosure involves forming a dielectric layer with bad step coverage on trenches with different widths, which results in different dielectric layer coverage profiles on trenches with different widths, such that the positions of the contact structure and the isolation structure can be directly defined without forming additional etching masks (e.g., patterned photoresist layer), and thus simplify the manufacturing process and reduce the cost of materials. The method in the present disclosure can also eliminate the problems resulting from the dielectric layer being too thick, and the photoresist layer not being completely developed and remaining in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In addition, although the disclosure has been described by way of example and in terms of the preferred embodiments, they are not used to limit the present disclosure. Not all advantages of the present disclosure are described in detail herein. Those skilled in the art may design or modify other processes and structures without departing from the spirit and scope of the present disclosure. Therefore, the scope of protection is better determined by the claims.

What is claimed is:

1. A semiconductor device, comprising:
   a semiconductor on an insulator (SOI) substrate comprising a bottom substrate, a buried oxide layer on the bottom substrate, and a semiconductor layer on the buried oxide layer;
   a first dielectric layer disposed on the semiconductor layer;
   a first contact structure extending from a top surface of the first dielectric layer through the semiconductor layer and the buried oxide layer and contacting the bottom substrate;
   a first trench extending into the semiconductor layer; and
   wherein a width of the first trench is smaller than a width of the first contact structure, the first dielectric layer seals the first trench near a top of the first trench to form a vacuum gap, and a portion of the first dielectric layer in the semiconductor layer directly contacts the first contact structure.

2. The semiconductor device of claim 1, wherein a ratio of the width of the first trench to the width of the first contact structure is 1:1.2 to 1:5.

3. The semiconductor device of claim 1, wherein the first dielectric layer comprises silane-based oxide, tetraethyl orthosilicate-based oxide (TEOS-based oxide) or a combination thereof.

4. The semiconductor device of claim 1, further comprising:
   a hard mask layer disposed between the semiconductor layer and the first dielectric layer; and
   wherein the first trench and the first contact structure extend through the hard mask layer.

5. The semiconductor device of claim 1, further comprising:
   an interlayer dielectric layer disposed on the first dielectric layer; and
   a second contact structure formed in the interlayer dielectric layer and electrically connected to the first contact structure.

6. The semiconductor device of claim 5, wherein the second contact structure is electrically connected to a voltage source so as to apply voltage to the bottom substrate.

7. The semiconductor device of claim 1, wherein a depth of the first trench is 2 μm to 80 μm.

8. The semiconductor device of claim 1, wherein from a top view, the first contact structure is ring-shaped.

9. A method for manufacturing a semiconductor device, comprising:
   providing a semiconductor on an insulator substrate comprising a bottom substrate, a buried oxide layer on the bottom substrate, and a semiconductor layer on the buried oxide layer;
   forming a first trench and a second trench extending into the semiconductor layer and exposing a top surface of the buried oxide layer, and wherein a width of the first trench is smaller than a width of the second trench;
   forming a first dielectric layer on the semiconductor layer, wherein the first trench is not filled by the first dielectric layer, and the first dielectric layer seals the first trench near a top of the first trench to form a vacuum gap;
   removing a portion of the first dielectric layer and a portion of the buried oxide layer which is under the second trench by performing an etching process to expose the bottom substrate, and wherein the first dielectric layer still seals the first trench after performing the etching process;
   forming a first contact structure contacting the bottom substrate by filling the second trench with a conductive material.

10. The method of claim 9, wherein there is no process of forming a photoresist layer on the first dielectric layer between forming the first dielectric layer and performing the etching process.

11. The method of claim 9, further comprising:
    forming an interlayer dielectric layer on the first dielectric layer;
    forming a second contact structure in the interlayer dielectric layer, wherein the second contact structure is electrically connected to the first contact structure.

12. The method of claim 9, wherein forming the first dielectric layer on the semiconductor layer comprises depositing silane-based oxide, tetraethyl orthosilicate-based oxide (TEOS-based oxide) or a combination thereof on the semiconductor layer using plasma-enhanced chemical vapor deposition (PECVD).

13. The method of claim 9, wherein formation of the first trench and second trench comprises:
    forming a hard mask layer on the semiconductor layer;
    patterning the hard mask layer; and
    using the patterned hard mask layer as an etching mask to etch the semiconductor layer.

14. The method of claim 9, wherein depths of the first trench and the second trench are 2 μm to 80 μm.

15. The method of claim 9, wherein a top of the vacuum gap tapers along a direction toward a top surface of the first dielectric layer, such that the top of the vacuum gap has a tapered profile.

16. The method of claim 9, wherein after forming the first dielectric layer, the second trench is not filled by the first dielectric layer and the first dielectric layer does not seal the second trench at or near a top of the second trench.

17. The method of claim 9, wherein a portion of the first dielectric layer remains on sidewalls of the second trench after performing the etching process.

* * * * *